US005783466A

United States Patent [19]
Takahashi et al.

[11] Patent Number: 5,783,466
[45] Date of Patent: Jul. 21, 1998

[54] SEMICONDUCTOR DEVICE AND METHOD OF MANUFACTURING THE SAME

[75] Inventors: Wataru Takahashi, Tokyo; Noriaki Dousen; Nobuyuki Sato, both of Yokohama, all of Japan

[73] Assignee: Kabushiki Kaisha Toshiba, Kawasaki, Japan

[21] Appl. No.: 821,385

[22] Filed: Mar. 20, 1997

Related U.S. Application Data

[63] Continuation of Ser. No. 316,483, Sep. 30, 1994.

[30] Foreign Application Priority Data

Oct. 25, 1993 [JP] Japan .................. 5-266336

[51] Int. Cl.⁶ .................................................. H01L 21/60
[52] U.S. Cl. .......................... 438/122; 438/123; 257/717
[58] Field of Search .................................. 257/717, 772, 257/753; 438/122, 413, 123

[56] References Cited

U.S. PATENT DOCUMENTS

| 3,829,598 | 8/1974 | Darnell ........................ 257/717 |
| 4,129,243 | 12/1978 | Cusano et al. ................ 257/712 |
| 5,317,194 | 5/1994 | Sako ............................ 257/717 |

FOREIGN PATENT DOCUMENTS

| 0 144 866 | 6/1985 | European Pat. Off. . |
| 0 206 771 | 12/1986 | European Pat. Off. . |
| 59-68958 | 4/1984 | Japan . |
| 5-267500 | 10/1993 | Japan . |
| 2084796 | 4/1982 | United Kingdom . |

*Primary Examiner*—John Niebling
*Assistant Examiner*—Kevin F. Turner
*Attorney, Agent, or Firm*—Finnegan, Henderson, Farabow, Garrett & Dunner, L.L.P.

[57] ABSTRACT

A semiconductor device according to the present invention includes a substrate made of an electrically insulative material having a relatively high thermal conductivity, a metallic pattern member provided on one major surface of the substrate and having an external terminal portion extending from the substrate, a semiconductor element mounted on the metallic pattern member, a metallic layer provided on the other major surface of the substrate, a heat dissipation plate fixed onto the metallic layer, and a mold body for coating both the substrate mounted with the semiconductor element and the heat dissipation plate so as to expose the external terminal portion. A method for manufacturing a semiconductor device according to the present invention includes a step of mounting a semiconductor element on a metallic pattern member provided on one major surface of a substrate made of an electrically insulative material having a relatively high thermal conductivity, the substrate having a metallic layer on the other major surface thereof, a step of fixing a heat dissipation plate onto the metallic layer, and a step of coating both the substrate mounted with the semiconductor element and the heat dissipation plate with an insulative material so as to expose the external terminal portion.

6 Claims, 4 Drawing Sheets

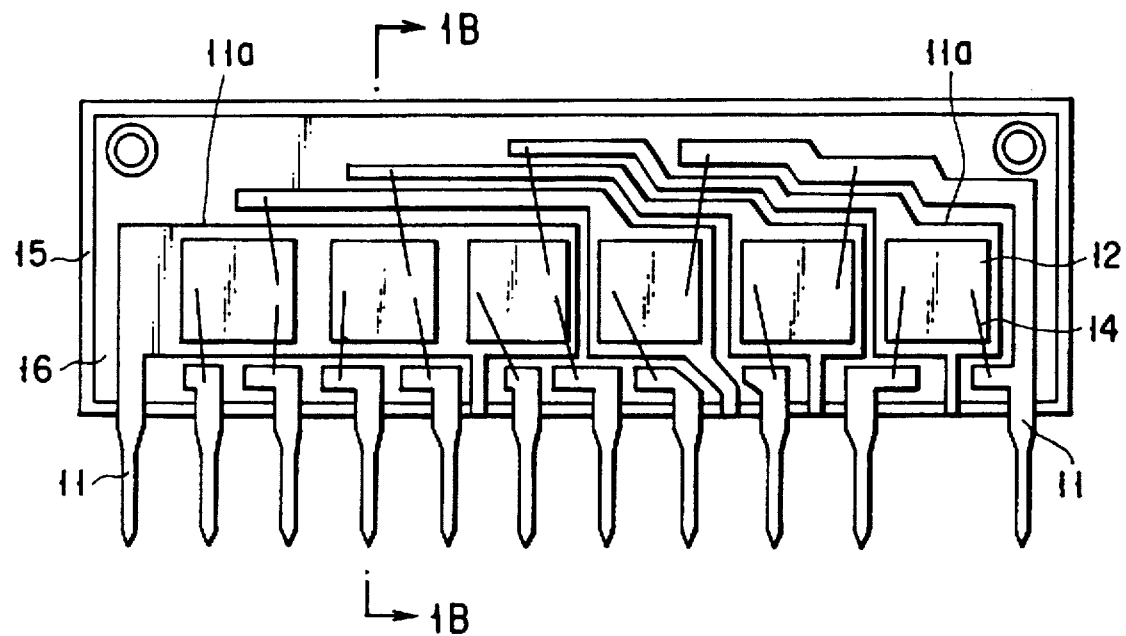
F I G. I A  PRIOR ART
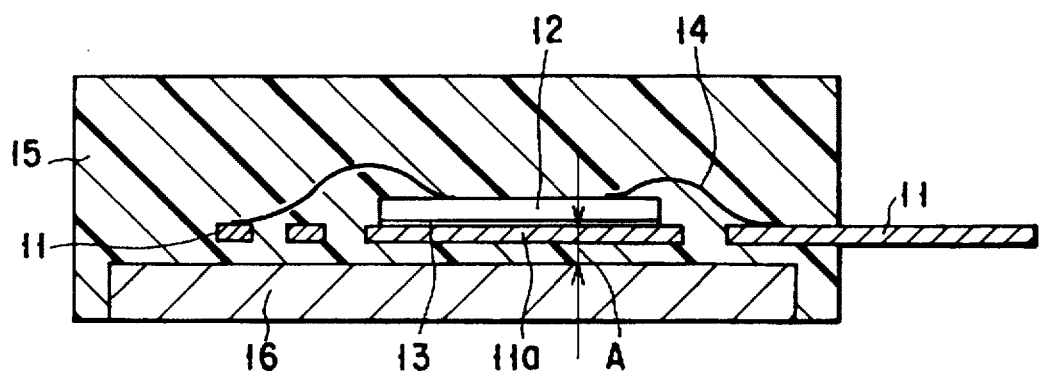
F I G. I B  PRIOR ART

SEMICONDUCTOR DEVICE AND METHOD OF MANUFACTURING THE SAME

This is division of application of application Ser. No. 08/316,483, filed Sep. 30, 1994.

BACKGROUND OF THE INVENTION

1. Field of the Invention

The present invention relates to a semiconductor device mounting a power transistor, a power IC, or the like and a method for manufacturing the same.

2. Description of the Related Art

A conventional resin-molded semiconductor device mounting power devices such as a power transistor and a power IC, is so constructed that the power devices are electrically insulated from an envelope (a peripheral member of the semiconductor device) other than the external electrode terminals (leads) in order to prevent an electrical short circuit from occurring between the power devices or between the power devices and externally-mounted heat dissipation plate. This type of conventional semiconductor device is shown in FIGS. 1A, 1B and 2A to 2C.

FIG. 1A is a plan view showing the inside of a conventional semiconductor device, and FIG. 1B is a cross-sectional view taken along the line 1B—1B of FIG. 1A. In these Figures, reference numeral 11 indicates leads. The leads 11 include a large bed 11a, and semiconductor elements 12 are mounted on the bed 11a. The semiconductor elements 12 are fixed onto the bed 11a by solder 13 and electrically connected to the leads 11. The leads 11 constitute a lead frame. Electrode pads (not shown) are provided on the upper surfaces of the semiconductor elements 12 and electrically connected to the leads 11 by bonding wires 14.

The leads 11 mounted with the semiconductor elements 12 are coated with an insulative material such as epoxy resin in order to electrically insulate the semiconductor elements 12 from outside. Part of each of the leads 11 protrudes from a mold body 15 formed of an insulative material, and this protruding part serves as an outer lead. A heat dissipation plate 16 formed of metal such as Al or Cu, is provided through an insulating layer under those surfaces of the leads 11 which are opposite to the surfaces thereof mounted with the semiconductor elements 12, and the insulative mold body 15 is formed between the leads 11 and plate 16. The mold body 15 can be obtained by arranging the leads 11 mounted with the semiconductor elements 12 and heat dissipation plate 16 at regular intervals and then by transfer molding using the insulative material.

FIG. 2A is a plan view showing another example of a conventional semiconductor device, FIG. 2B is a side view thereof, and FIG. 2C is a cross-sectional view taken along the line 2C—2C of FIG. 2A. In FIGS. 2A to 2C, the same components as those in FIGS. 1A and 1B are denoted by the same reference numerals and their descriptions are omitted. In FIG. 2C, reference numeral 21 indicates a ceramic substrate. A circuit pattern 22 of copper is formed on the mounting surface of the ceramic substrate 21, and a copper layer 30 is formed on the opposite surface of the mounting surface. This substrate is a so-called DBC (Direct Bonding Copper) substrate. The circuit pattern 22 has a large bed 22a, and semiconductor elements 12 are mounted on the bed 22a.

A heat dissipation plate 16 is fixed onto the copper layer 30 by solder 23. A resin case 24 is adhered to the periphery of the heat dissipation plate 16 through an adhesive layer 25. The resin case 24 is filled with a gel material 26 such as silicone resin, and the semiconductor elements 12 and DBC substrate are coated with the gel material 26. A casting layer 27 of thermosetting resin is formed on the surface of the gel material 26. Further, a terminal holder 28 is provided on the casting layer 27, and pin-like electrode terminals 29 are attached to the terminal holder 28. One end of each electrode terminal 29 is electrically connected to the circuit pattern 22 through the casting layer 27 and gel material 26. The other end thereof protrudes from the terminal holder 28 and serves as an outer lead.

In the foregoing resin-sealed semiconductor devices incorporating power devices, it is important to cause the heat generated from the power devices to quickly dissipate outside, that is, to improve the property of dissipation heat. Therefore, the characteristics of the power devices can be made effective, and the reliability of the device can be maintained even after the device is used for a long time. It is thus very important to reduce thermal resistance applied from the power devices to the surface of the envelope (peripheral member) in order to improve the property of heat dissipation from the power devices.

However, the conventional semiconductor device shown in FIGS. 1A and 1B has a relatively high thermal resistance. This is because thermal conductivity K of the insulative material used for the mold body is considerably smaller than that of ceramics or the like.

Because of restrictions on the manufacture technology, thickness A of the insulative material between the leads 11 and heat radiating plate 16 cannot be decreased to such an extent as to show the same thermal conductivity as that of ceramics. For example, if the semiconductor device shown in FIG. 1B is manufactured by use of molding resin having the highest thermal conductivity on the market (K=0.04 W/cm·°C.), thickness A of the insulative material has to be not more than 0.12 mm in order to obtain the same thermal conductivity as that of alumina ceramic (K=0.2 W/cm·°C.) having a thickness of 0.6 mm which is used in the semiconductor device shown in FIGS. 2A to 2C.

According to the current manufacture technique, however, thickness A is limited to 0.5 mm, and cannot be set to 0.12 mm or less. Since, furthermore, the average grain diameter of molding resin is about 0.3 mm, if thickness A is set to be smaller than 0.5 mm, a void occurs inevitably, and the semiconductor device is reduced in quality and reliability. Consequently, the conventional semiconductor device shown in FIGS. 1A and 1B is inferior in heat dissipation.

Though the conventional semiconductor device of FIGS. 2A to 2C is superior in heat dissipation to that of FIGS. 1A and 1B, it requires a larger number of structural elements and a larger number of manufacturing steps, with the result that the device is complicated and expensive. For example, the number of main structural elements of the device shown in FIGS. 1A and 1B is five (lead frame, semiconductor element, heat dissipation plate, bonding wire, and molding resin), while that of the device shown in FIGS. 2A to 2C is nine (DBC substrate, semiconductor element, heat dissipation plate, bonding wire, adhesive for adhering the case, resin case, gel material, casting material, terminal holder including terminal electrode). The method for manufacturing the device shown in FIGS. 1A and 1B includes three steps of die bonding, wire bonding, and transfer molding, whereas the method for manufacturing the device shown in FIGS. 2A to 2C includes six steps of die bonding, wire bonding, mounting of heat dissipation plate and terminal holder (reflow), mounting of resin case (joining), first filling of resin (potting), and second filling of resin (casting).

SUMMARY OF THE INVENTION

An object of the present invention is to provide a semiconductor device which is light, simple and excellent in heat dissipation, and a method for manufacturing the same with high efficiency.

To attain the above object, there is provided a semiconductor device comprising a substrate made of an electrically insulative material having a relatively high thermal conductivity, a metallic pattern member provided on one major surface of the substrate and having an external terminal portion extending from the substrate, a semiconductor element mounted on the metallic pattern member, a metallic layer provided on the other major surface of the substrate, a heat dissipation plate fixed onto the metallic layer, and a mold body for coating both the substrate mounted with the semiconductor element and the heat dissipation plate so as to expose the external terminal portion.

To attain the above object, there is also provided a method for manufacturing a semiconductor device, comprising the steps of mounting a semiconductor element on a metallic pattern member provided on one major surface of a substrate made of an electrically insulative material having a relatively high thermal conductivity, the substrate having a metallic layer on the other major surface thereof, fixing a heat dissipation plate onto the metallic layer, and coating both the substrate mounted with the semiconductor element and the heat dissipation plate with an insulative material so as to expose the external terminal portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a plan view showing a conventional semiconductor device;

FIG. 1B is a cross-sectional view taken along the line 1B—1B of FIG. 1A;

DETAILED DESCRIPTION OF THE PREFERRED EMBODIMENTS

Figure 2A:
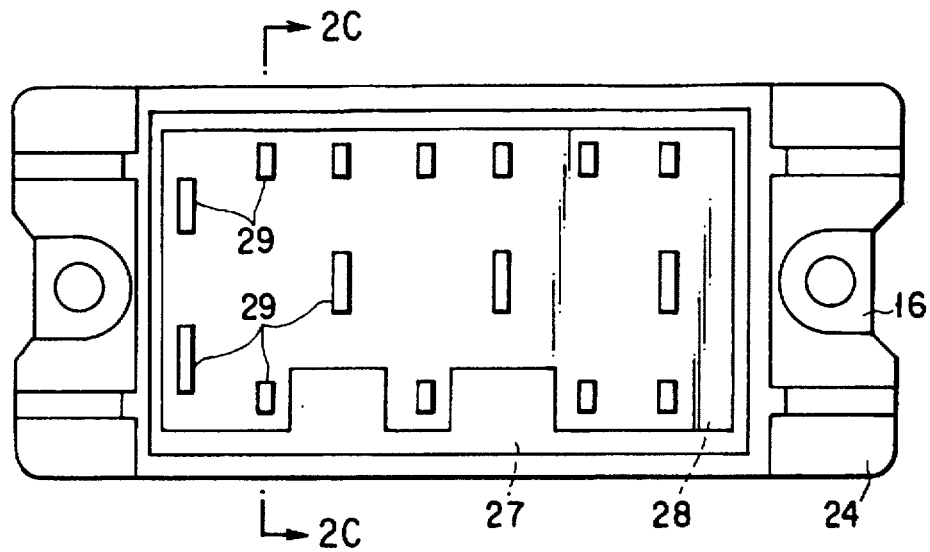
FIG. 2A is a plan view showing another conventional semiconductor device.

A semiconductor device of the present invention is featured by comprising a substrate made of an electrically insulative material having a relatively high thermal conductivity, a metallic pattern member provided on one major surface of the substrate and having an external terminal portion extending from the substrate, a semiconductor element mounted on the metallic pattern member, a metallic layer provided on the other major surface of the substrate, a heat dissipation plate fixed onto the metallic layer, and a mold body for coating both the substrate mounted with the semiconductor element and the heat dissipation plate so as to expose the external terminal portion.

As the electrically insulative material for the substrate, ceramics such as alumina ($Al_2O_3$), aluminum nitride ($AlN_x$) may be used. As the material for the metallic pattern member, copper, copper alloy and the like may be used. Further, as the material for the metallic layer, copper, copper alloy, and the like may be used. A DBC substrate can be used for the substrate having the metallic pattern member and metallic layer. As the material for the heat dissipation plate, aluminum, copper, iron, and the like may be used. As the material for the mold body, epoxy resin, silicone resin, etc may be used.

In the semiconductor device having the above constitution, the heat generated from the semiconductor element is transmitted to the substrate through the metallic pattern, then transmitted to the heat dissipation plate through the metallic layer, and emitted outside therefrom. The heat dissipation of the semiconductor element is therefore improved. Since, furthermore, the external terminal portion of the metallic pattern member can be employed as an external terminal of the semiconductor element, the number of elements constituting the semiconductor device can be decreased, and the semiconductor device can be lightened accordingly.

A method for manufacturing a semiconductor device according to the present invention is featured by comprising a step of mounting a semiconductor element on a metallic pattern member provided one major surface of a substrate made of an electrically insulative material having a relatively high thermal conductivity, the substrate having a metallic layer on another major surface thereof, a step of fixing a heat dissipation plate onto the metallic layer, and a step of coating both the substrate mounted with the semiconductor element and the heat dissipation plate with an insulative material so as to expose the external terminal portion.

The step of mounting the semiconductor element on the metallic pattern member of the substrate can be executed by normal die bonding and wire bonding. The step of fixing the heat dissipation plate onto the metallic layer can be executed by reflow using a brazing filler such as solder. The step of coating both the substrate and heat dissipation plate with the insulative material can be executed by transfer molding using thermosetting resin such as epoxy resin, silicone resin, and the like.

The steps of the above-described method according to the present invention can be simplified since the structural elements of the semiconductor device are decreased in number. Consequently, the semiconductor device which is excellent in heat dissipation can be manufactured with efficiency and at low cost.

An embodiment of the present invention will now be described, with reference to the accompanying drawings.

Figure 3A:
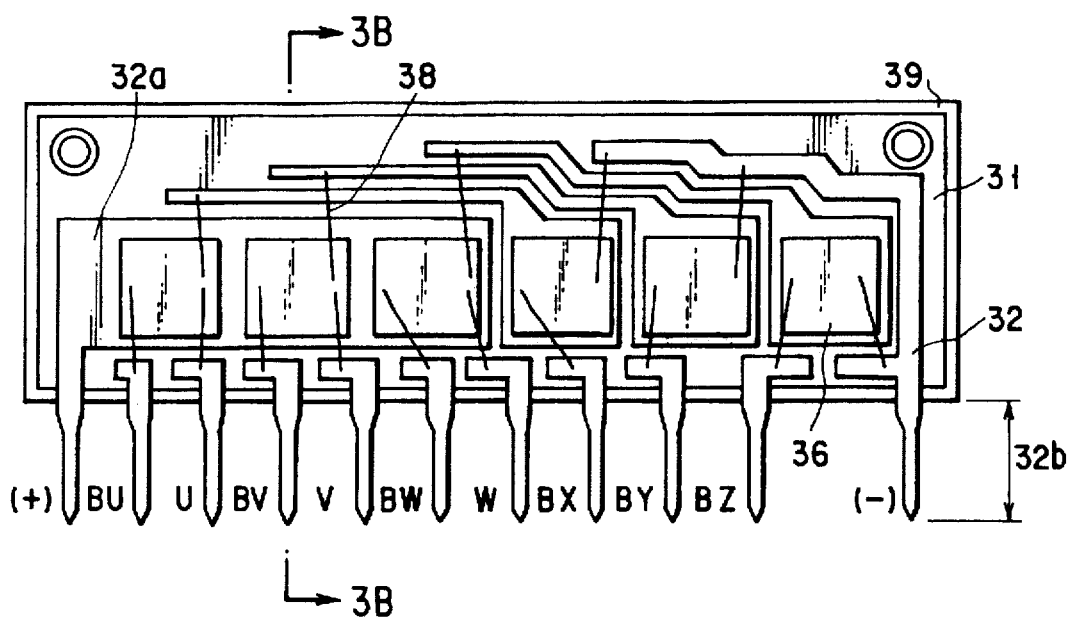
FIG. 3A is a plan view showing a semiconductor device according to one embodiment of the present invention.
Figure 3B:
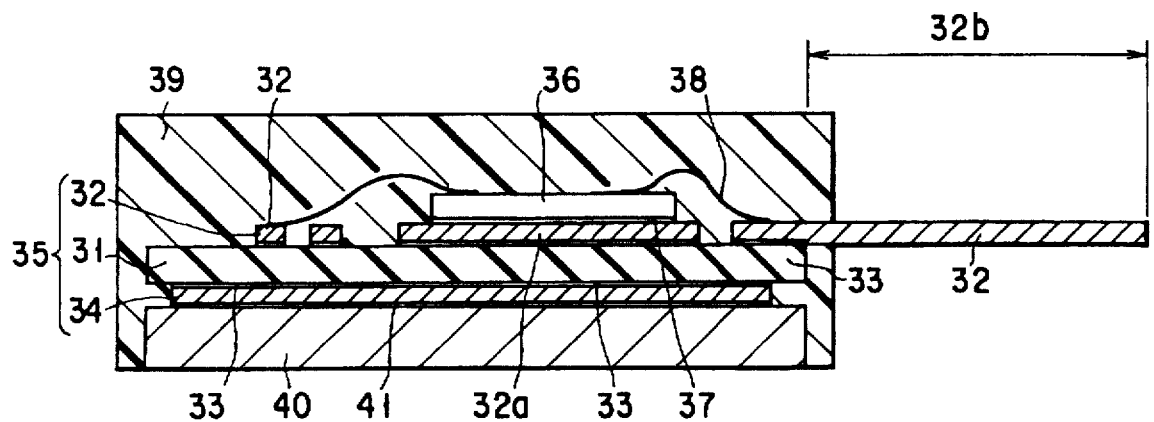
FIG. 3B is a cross-sectional view taken along the line 3B—3B of FIG. 3A.

FIG. 3A is a plan view of a semiconductor device according to the embodiment of the present invention, showing the inside of the device from top, and FIG. 3B is a cross-sectional view taken along the line 3B—3B of FIG. 3A. In these figures, reference numeral 31 indicates an electrically insulative ceramic substrate having a relatively high thermal conductivity. A copper circuit pattern member 32 is provided on the mounting surface of the ceramic substrate 31. The pattern member 32 includes a bed 32a having a large area and external terminal portions 32b extending from the ceramic substrate 31. An alloy layer 33 of ceramic and copper is formed between the ceramic substrate 31 and copper circuit pattern member 32 to fix the pattern member 32 onto the substrate 31. Further, a copper layer 34 is fixed onto the opposite surface (hereinafter referred to as the undersurface) of the mounting surface of the ceramic substrate 31 by means of the alloy layer 33. The ceramic substrate 31, copper circuit pattern member 32, and copper layer 34 constitute a DBC (Direct Bonding Copper) substrate 35.

Power device pellets 36 each incorporating a power transistor, a power IC or the like, are mounted on the bed 32a. More specifically, the pellets 36 are fixed onto the bed 32a by solder 37 and electrically connected to the copper circuit pattern member 32. It is preferable that high melting point solder such as Pb-Sn-Ag series solder should be used as the solder 37. In this embodiment, high melting point solder having a melting point of about 310° C. is employed. Electrode pads (not shown) are provided on the surfaces of the pellets 36 and electrically connected to the copper circuit pattern member 32 by bonding wires 38 of gold (Au), aluminum (Al) or the like.

A heat dissipation plate 40 is mounted on the copper layer 34 by means of solder 41 such as Pb-Sn series solder. The plate 40 is exposed to outside and serves to cause the heat generated from the pellets 36 to dissipate outside the device.

A substantially cuboid-shaped mold body 39 is provided around the DBC substrate 35 to coat both the DBC substrate 35 mounted with the pellets 36 and the heat dissipation plate 40 such that the external terminal portion 32b of the copper circuit pattern member 32 is exposed. The mold body 39 electrically insulates the pellets 36 from outside. The exposed external terminal portion 32b is used as an outer lead.

Figure 4:
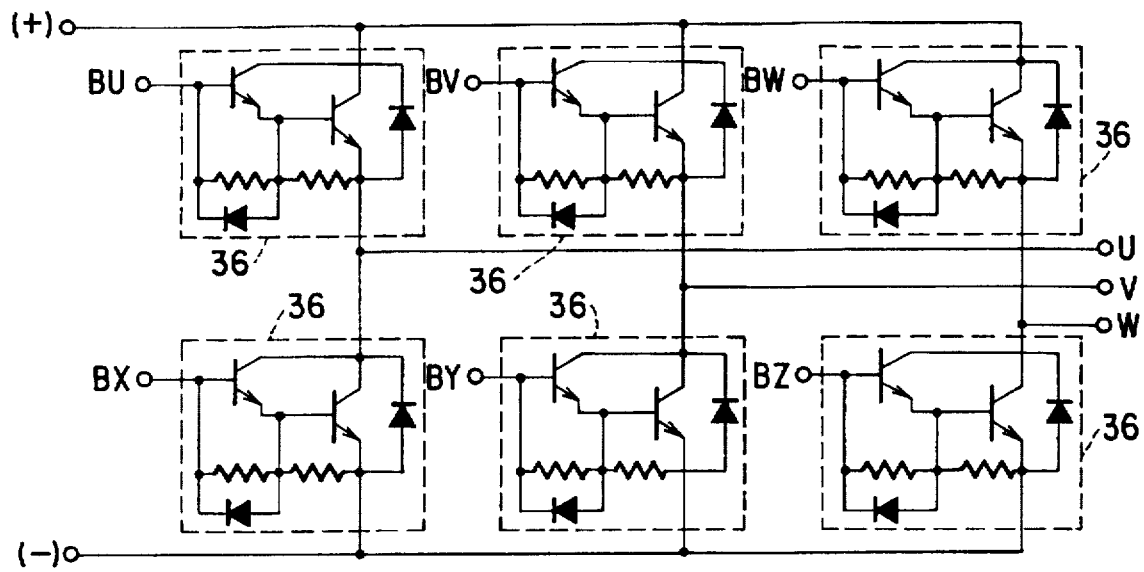
FIG. 4 is a circuit diagram for explaining a circuit of the semiconductor device shown in FIG. 3A.

The semiconductor device of the present invention having the above constitution is directed to a motor driving inverter circuit device. The inverter circuit device incorporates six pellets 36 and its circuit diagram is shown in FIG. 4. Referring to FIG. 4, each of the pellets 36 has a base terminal, a collector terminal, and an emitter terminal, and functions as a single power device (a bipolar transistor in this embodiment). The pellet 36 includes Darlington-connected two power transistors (of a bipolar type), a diode, a resistor, and the like, and is formed as an integrated circuit or a sort of power IC which is capable of driving a large current.

The motor driving inverter circuit shown in FIG. 4 is constituted by the six pellets 36 including the power devices or power ICs. All the pellets 36 are incorporated in a single envelope to serve as one resin-molded semiconductor device. It is therefore eleven outer leads that protrude from the mold body 39 and include a positive power supply terminal (+), a negative power supply terminal (−), six input terminals BU, BV, BW, BX, BY and BZ, and three output terminals U, V and W. In FIG. 3A, the same reference numerals as those of FIG. 4 are shown in the vicinity of the outer leads.

Figure 5A:
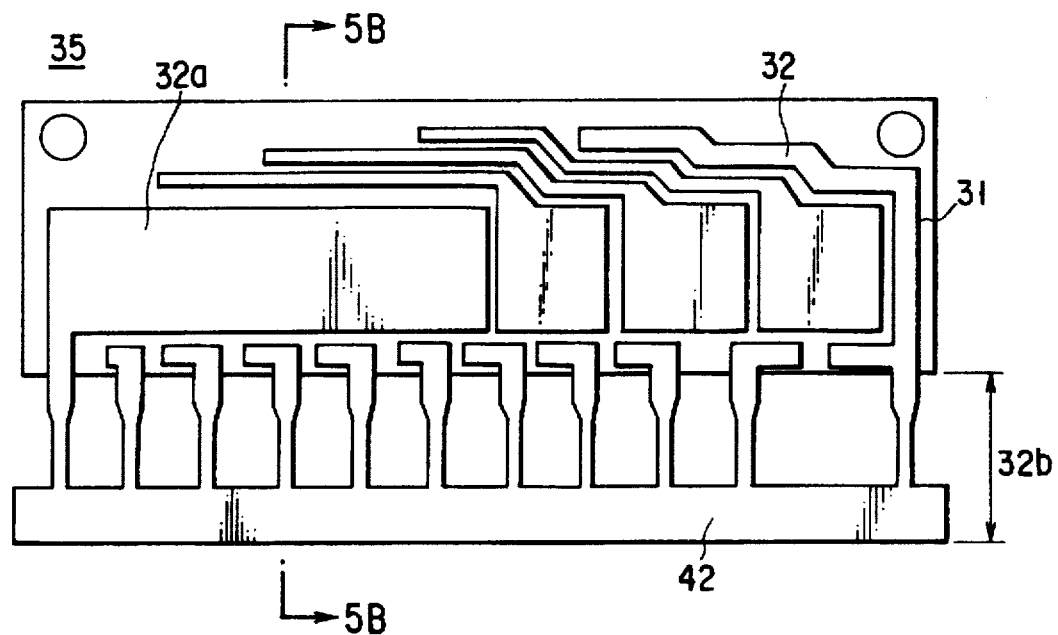
FIG. 5A is a plan view showing a DBC substrate of the semiconductor device of the present invention.
Figure 5B:
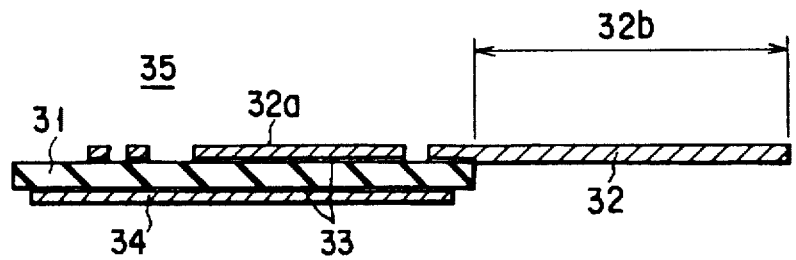
FIG. 5B is a cross-sectional view taken along the line 5B—5B of FIG. 5A.

A method for manufacturing the semiconductor device shown in FIG. 3 will now be described. FIG. 5A is a plan view of the DBC substrate 35 of the semiconductor device according to the embodiment of the present invention, and FIG. 5B is a cross-sectional view taken along the line 5B—5B of FIG. 5A. As illustrated in FIG. 5A, the DBC substrate 35 has a tie bar 42 for connecting the external terminal portions 32b, in the vicinity of the end portion of the copper circuit pattern member 32, thereby to form a lead frame. Since the pattern member 32 is in the shape of a lead frame, the semiconductor device can be assembled continuously.

The manufacturing method will be described more specifically.

First a DBC substrate 35 provided with a copper circuit pattern member 32 in the shape of a lead frame, is prepared, as shown in FIGS. 5A and 5B. Pellets 36 are fixed onto a bed 32a formed on the pattern member 32 using high melting point solder 37 (die bonding), and electrode pads (not shown) provided on the pellets 36 and copper circuit pattern member 32 are electrically connected to each other by use of bonding wires 38 of gold (Au), aluminum (Al) or the like (wire bonding). Then a metallic heat dissipation plate 40 is fixed onto the undersurface of the DBC substrate 35, i.e., onto the surface of copper layer 34, using solder 41 (mounting of heat dissipation plate by reflow). After that, the DBC substrate 35 mounted with the heat dissipation plate 40 is located in a mold (not shown), and resin is caused to pour into the mold for transfer molding, thereby forming a cuboid-like mold body 39 around the DBC substrate 35 (molding). Finally a tie bar 42 connecting the external terminal portions 32b of the copper circuit pattern member 32 is cut and removed, and the portions 32b are formed into a desired shape (outer lead forming). By doing so, the semiconductor device of the present invention is obtained.

According to the semiconductor device described above, since the copper circuit pattern member 32 almost directly contacts the ceramic substrate 31, the pellets 36 are virtually placed into contact with the ceramic substrate 31 simply through the copper circuit pattern member 32. For this reason, the heat generated from the pellets 36 is transmitted to the ceramic substrate 31 formed of a material having a relatively high thermal conductivity, through the copper circuit pattern member 32, then transmitted to the heat dissipation plate 40 through the copper layer 34, and emitted outside therefrom. Therefore, the heat dissipation of the pellets 36 can be improved more than that of the conventional semiconductor device (shown in FIGS. 1A and 1B) which is so constructed that resin is inserted under the bed on which the pellets are placed. More specifically, the thermal resistance of the envelope of the conventional semiconductor device is about 4° C./W for each power device pellet of 5 mm$^2$, while that of the envelope of the semiconductor device of the present invention is reduced to less than half of 4° C./W, that is, about 1.5° C./W for each power device pellet of 5 mm$^2$.

According to the semiconductor device having the above constitution, since the copper circuit pattern member is supported by the ceramic substrate, the DBC substrate can stably be coated when the mold body is formed by the transfer molding. Since the copper circuit pattern member is reliably supported, its thickness can be decreased.

Figure 2B:
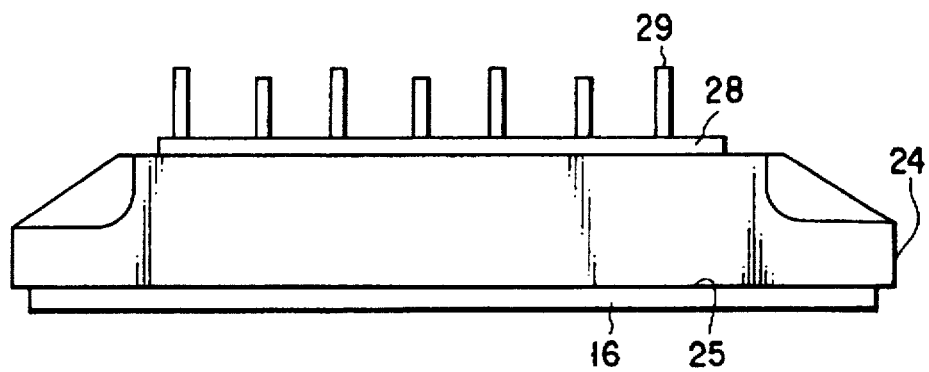
FIG. 2B is a side view of the semiconductor device shown in FIG. 2A.
Figure 2C:
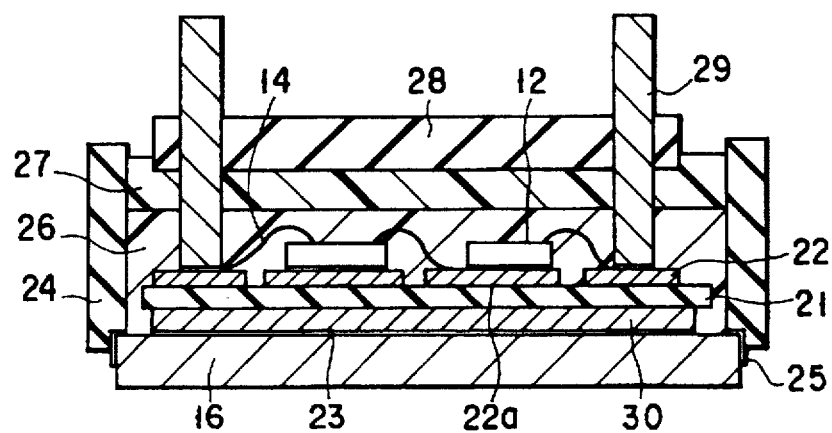
FIG. 2C is a cross-sectional view taken along the line 2C—2C of FIG. 2A.

In the semiconductor device of the present invention, the external terminal sections 32b of the copper circuit pattern member 32 are extended from the ceramic substrate 31 and used as external electrode terminals of the pellets 36. Using the copper circuit pattern member 32 as external electrode terminals, the number of structural elements of the semiconductor device can be reduced, and the cost for the elements can be lowered accordingly. Since the structural elements of the semiconductor device can be decreased in number, the number of steps of manufacturing the device can be reduced, thereby lowering the manufacture cost. For example, the conventional semiconductor device shown in FIGS. 2A to 2C is likely to be expensive since it requires a large number of structural elements. However, in the semiconductor device of the present invention, the number of main structural elements has only to be five, that is, the DBC substrate, pellets, heat dissipation plate, wires, and resin, and the number can be decreased by four, compared with that of structural elements for the conventional device shown in FIGS. 2A to 2C. Moreover, in the embodiment of the present invention, the number of manufacture steps has only to be five, that is, die bonding, wire bonding, mounting of heat dissipation plate using reflow, molding, and outer lead forming, which is less than that of manufacturing steps of the conventional device by one. As a result, the manufacture cost can be lowered further.

In the foregoing semiconductor device of the present invention, since the copper circuit pattern member is formed in the shape of a lead frame, resin molding operations such as transfer molding can be performed continuously and simultaneously. In the conventional semiconductor device shown in FIG. 2, a resin molding operation has to be performed for each individual product, which is inferior in mass productivity and operability, whereas the manufacture method of the present invention is very effective in mass productivity and operability.

The present invention is not limited to the above embodiment. For example, in place of the aluminum, aluminum nitride ($AlN_x$) can be used as a material for the ceramic substrate 31. Though the aluminum nitride is more expensive than the alumina, and a direct bonding method such as a DBC method cannot be applied to the aluminum nitride, its thermal conductivity is higher than that of the alumina and suitable to improve in heat dissipation. When the aluminum nitride is used for the ceramic substrate 31, the substrate 31 can be fixed onto the copper circuit pattern member 32 by using a brazing filler containing an element of group IV of the periodic table, such as Ti. The bonding method using the brazing filler is generally called active metal bonding.

As described above, the semiconductor device according to the present invention is light, simple, and excellent in heat dissipation, and can be obtained with efficiency.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

mounting a semiconductor element on a metallic pattern member fixed onto one major surface of a substrate by an alloy layer interposed between the pattern member and the substrate, said alloy layer composed of material constituting the pattern member and the substrate, said metallic pattern member configured to have an external terminal portion extending from said substrate substantially parallel with said one major surface of said substrate, and said substrate made of an electrically insulative material having a relatively high thermal conductivity;

fixing a metallic layer onto another major surface of said substrate by an alloy layer interposed between the metallic layer and the substrate, said alloy layer composed of material constituting the metallic layer and the substrate;

fixing a heat dissipation plate onto said metallic layer; and coating both said substrate mounted with said semiconductor element and said heat dissipation plate with an insulative material so as to expose the external terminal portion.

2. The method according to claim 1, wherein said metallic pattern member has a distal end connected to the external terminal portion.

3. The method according to claim 1, wherein said semiconductor element is mounted on said metallic pattern member by die bonding and wire bonding.

4. The method according to claim 1, wherein said heat dissipation plate is fixed onto said metallic layer by heat treatment using a brazing filler.

5. The method according to claim 1, wherein said substrate mounted with said semiconductor element, and said heat dissipation plate are coated with an insulative material by transfer molding.

6. The method according to claim 5, wherein said insulative material is epoxy resin or silicone resin.

* * * * *